(12) United States Patent
Sogawa et al.

(10) Patent No.: US 7,808,326 B2
(45) Date of Patent: Oct. 5, 2010

(54) PLL CIRCUIT

(75) Inventors: Kazuaki Sogawa, Osaka (JP); Masayoshi Kinoshita, Osaka (JP); Yuji Yamada, Osaka (JP); Junji Nakatsuka, Osaka (JP)

(73) Assignee: Panasonic Corporation, Osaka (JP)

( * ) Notice: Subject to any disclaimer, the term of this patent is extended or adjusted under 35 U.S.C. 154(b) by 356 days.

(21) Appl. No.: 11/993,108

(22) PCT Filed: Mar. 29, 2007

(86) PCT No.: PCT/JP2007/056817

§ 371 (c)(1),
(2), (4) Date: Dec. 19, 2007

(87) PCT Pub. No.: WO2008/044350

PCT Pub. Date: Apr. 17, 2008

(65) Prior Publication Data

US 2009/0295489 A1    Dec. 3, 2009

(30) Foreign Application Priority Data

Oct. 12, 2006    (JP) .............................. 2006-279165

(51) Int. Cl.
*H03L 7/00* (2006.01)
(52) U.S. Cl. .............................. 331/16; 331/17; 331/34; 331/177 R
(58) Field of Classification Search .................... 331/16, 331/34, 177 R, 17
See application file for complete search history.

(56) References Cited

U.S. PATENT DOCUMENTS 7,327,195 B2 * 2/2008 Sawada ........................ 331/16

2001/0052811 A1    12/2001 Kim (Continued)

FOREIGN PATENT DOCUMENTS

JP    07-095069    4/1995

(Continued)

OTHER PUBLICATIONS

Japanese Notice of Reasons for Rejection, with English Translation, issued in Japanese Patent Application No. 2007-540007, mailed Jan. 12, 2010.

*Primary Examiner*—Arnold Kinkead
(74) *Attorney, Agent, or Firm*—McDermott Will & Emery LLP

(57) ABSTRACT

In a PLL circuit, a voltage controlled oscillator 4 has two voltage-current conversion circuits 40 and 41 and a selection circuit 42 for selecting an output of either one of the voltage-current conversion circuits 40 and 41. The output of the voltage-current conversion circuit selected by the selection circuit 42 is inputted to a current controlled oscillator 45. The one voltage-current conversion circuit 41 has an input thereof connected to an output of a loop filter 3, while the other voltage-current conversion circuit 40 has an input thereof connected to an input terminal 8 for evaluating the oscillation characteristics of the voltage controlled oscillator 4. As a result, time-varying fluctuations in the voltage of the loop filter resulting from a structure in which the input terminal for evaluating the oscillation characteristics of the voltage controlled oscillator is connected to the loop filter via a switch and time-varying fluctuations in the output frequency of the PLL circuit are effectively suppressed.

11 Claims, 11 Drawing Sheets

U.S. PATENT DOCUMENTS

| | | |
|---|---|---|
| 2003/0011247 A1 | 1/2003 | Kajiwara et al. |
| 2004/0251973 A1 | 12/2004 | Ishida et al. |
| 2006/0017477 A1 | 1/2006 | Miki et al. |
| 2007/0085612 A1 | 4/2007 | Kodama |

FOREIGN PATENT DOCUMENTS

| | | |
|---|---|---|
| JP | 09-252250 | 9/1997 |
| JP | 11-195983 | 7/1999 |
| JP | 2001-119297 | 4/2001 |
| JP | 2001-230667 | 8/2001 |
| JP | 2002-026727 | 1/2002 |
| JP | 2003-143836 | 5/2003 |
| JP | 2005-051732 | 2/2005 |
| JP | 2005-354317 | 12/2005 |
| JP | 2006-033197 | 2/2006 |
| JP | 2006-041810 | 2/2006 |
| JP | 2006-042352 | 2/2006 |
| JP | 2006-066971 | 3/2006 |

* cited by examiner

PLL CIRCUIT

RELATED APPLICATIONS

This application is the U.S. National Phase under 35 U.S.C. §371 of International Application No. PCT/JP2007/056817, filed on Mar. 29, 2007, which in turn claims the benefit of Japanese Application No. 2006-279165, filed on Oct. 12, 2006, the disclosures of which Applications are incorporated by reference herein.

TECHNICAL FIELD

The present invention relates to a PLL (Phase Locked Loop) circuit having the function of evaluating the oscillation characteristics of a voltage controlled oscillator.

BACKGROUND ART

A view showing a conventional structure of a PLL circuit having a circuit for evaluating the oscillation characteristics of a voltage controlled oscillator (hereinafter abbreviated as VCO) is shown in FIG. 11.

In FIG. 11, 1 is a phase comparator, 2 is a charge pump circuit, 3 is a loop filter, 4 is a voltage controlled oscillator (hereinafter abbreviated as VCO), 5 is a frequency division circuit, 7 is a test control signal, 64 and 65 are switches controlled by the test control signal 7 mentioned above, 6 is an input signal, 8 is a VCO input control terminal. The PLL circuit is composed of the phase comparator 1, the charge pump circuit 2, the loop filter 3, the VCO 4, and the frequency division circuit 5 which are connected in a loop-like configuration. The input 67 of the VCO 4 is connected to the VCO input control terminal 8 via the switch 64 controlled by the test control signal 7 and connected to the loop filter 3 via the switch 65 controlled by the test control signal 7. The VCO 4 mentioned above comprises a voltage-current conversion circuit 4a and a current controlled oscillator 4b.

A description will be given herein below to an operation of the PLL circuit thus constructed.

In FIG. 11, in the case of operation as the PLL circuit, the test control signal 7 turns OFF the switch 64 and turns ON the switch 65 so that the input 67 of the VCO 4 is connected to the loop filter 3. As a result, the phase comparator 1, the charge pump 2, the loop filter 3, the VCO 4, and the frequency division circuit 5 are connected in the loop-like configuration to operate as the PLL circuit.

Next, in FIG. 11, in the case of evaluation of the oscillation characteristics of the VCO 4, the test control signal 7 turns ON the switch 64 and turns OFF the switch 65 so that the input 67 of the VCO 4 is connected to the VCO input control terminal 8. As a result, the VCO 4 is disconnected from the loop constituting the PLL circuit so that an output frequency is controlled by a voltage inputted from the VCO input control terminal 8. This allows evaluation of the oscillation characteristics of the VCO 4.

As a PLL circuit having such a conventional structure, there is known one disclosed in, e.g., Patent Document 1. In Patent Document 1, the PLL circuit is used to monitor the oscillation characteristics of a VCO with the structure described above and automatically adjust the oscillation characteristics of the VCO.

Patent Document 1: Japanese Laid-Open Patent Publication No. HEI 11-195983 (pages 9 to 11).

DISCLOSURE OF THE INVENTION

Problem to be Solved by the Invention

When the conventional PLL circuit described above is in a locked state where the output frequency, which is an output of the PLL circuit, has a substantially constant value, the output portion of the loop filter 3 is in a high-impedance state. However, since the selection switch 64 is connected to the output portion of the loop filter 3 in the high-impedance state, an extremely weak current leaks from the output portion of the loop filter 3 in the high-impedance state via the switch 64. Accordingly, the problem has been recognized that the output voltage (voltage at the input 67 of the VCO 4) of the loop filter 3 fluctuates due to the extremely weak leak current, the output frequency of the PLL circuit also fluctuates in response to the fluctuations, and the output frequency cannot be controlled to a constant value with high accuracy.

The present invention aims at solving the conventional problem described above and an object of the present invention is to provide a PLL circuit which has the function of evaluating the oscillation characteristics of a VCO and prevents increased fluctuations in output frequency.

Means for Solving the Problems

To attain the object described above, the present invention does not adopt such a conventionally adopted structure in which a selection switch is provided in the output portion of a loop filter which is in a high-impedance state when a PLL circuit is in a locked state.

Specifically, a PLL circuit of the present invention comprises: a phase comparator; a charge pump circuit; a loop filter; a voltage controlled oscillator; and a frequency division circuit, wherein the voltage controlled oscillator comprises: at least two input terminals; two voltage-current conversion circuits for converting respective voltages at the two input terminals to currents; a selection circuit for selecting either one of the two voltage-current conversion circuits; and an oscillator having an oscillation frequency thereof varied by an output current from the voltage-current conversion circuit selected by the selection circuit and at least one of the input terminals of the voltage controlled oscillator is connected to the loop filter and at least one other of the input terminals serves as an input terminal for evaluating the voltage controlled oscillator.

In the PLL circuit of the present invention, each of the voltage-current conversion circuits is composed of an N-channel transistor having a gate as an input terminal, a source as a ground terminal, and a drain as an output terminal.

In the PLL circuit of the present invention, each of the voltage-current conversion circuits is composed of a P-channel transistor having a gate as an input terminal, a source as a power source terminal, and a drain as an output terminal.

In the PLL circuit of the present invention, each of the voltage-current conversion circuits is composed of: an arithmetic amplifier using one of the two input terminals as a negative-electrode input; a P-channel transistor having a gate connected to an output of the arithmetic amplifier, a source connected to a power source terminal, and a drain connected to a positive-electrode input of the arithmetic amplifier; a resistor connected between the drain of the P-channel transistor and a ground terminal; and a P-channel transistor having a gate connected to the output of the arithmetic amplifier, a source connected to the power source terminal, and a drain as an output terminal.

In the PLL circuit of the present invention, in each of the voltage-current conversion circuits, the arithmetic amplifier having the negative-electrode input to which the input terminal connected to the loop filter is connected has a terminal for monitoring a voltage of the loop filter connected to the positive-electrode input of the arithmetic amplifier.

In the PLL circuit of the present invention, the charge pump circuit is composed of: a charge current source; a discharge current source; a switch connected between the charge current source and an output side of the charge pump circuit; a switch connected between the discharge current source and the output side of the charge pump circuit; a unity gain buffer having an input connected to the output side of the charge pump circuit; a switch connected between the charge current source and an output side of the unity gain buffer; and a switch connected between the discharge current source and the output side of the unity gain buffer, wherein the output side of the unity gain buffer composing the charge pump circuit is used as the terminal for monitoring the voltage of the loop filter.

The PLL circuit of the present invention further comprises: a control circuit for controlling a state of the output of the charge pump circuit to adjust the voltage of the loop filter to a ground voltage or a power source voltage.

In the PLL circuit of the present invention, the charge pump circuit has the function of increasing charge/discharge currents in adjusting the voltage of the loop filter to the ground voltage or the power source voltage using the control circuit.

Another PLL circuit of the present invention comprises: a phase comparator; a charge pump circuit; a loop filter; a voltage controlled oscillator; and a frequency division circuit, wherein the charge pump circuit comprises: a charge current source; a discharge current source; a switch connected between the charge current source and an output of the charge pump circuit; a switch connected between the discharge current source and the output of the charge pump circuit; a unity gain buffer having an input connected to the output of the charge pump circuit; a switch connected between the charge current source and an output of the unity gain buffer; and a switch connected between the discharge current source and the output of the unity gain buffer, the PLL circuit further comprising: two variable resistors; and switches for switching the charge current source and the discharge current source to the two variable resistors each in accordance with a control signal, the PLL circuit having the function of applying an arbitrary voltage to the loop filter by controlling a resistance ratio between the two variable resistors when the charge current source and the discharge current source are switched to the two variable resistors.

In the PLL circuit of the present invention, the output of the unity gain buffer of the charge pump circuit is used as a monitor terminal for monitoring a voltage of the loop filter.

Thus, in the present invention, the selection circuit is placed in the stage subsequent to the two voltage-current conversion circuits, i.e., at a portion biased with a current inside the voltage controlled oscillator. Accordingly, unlike in the conventional PLL circuit, a selection switch for a selective switch to the input terminal for evaluating the oscillation characteristics of the voltage controlled oscillator need not be placed in the output portion of the loop filter in the high-impedance state. This allows complete elimination of time-varying fluctuations in the output voltage of the loop filter due to an extremely weak leakage current from the selection switch, which have been conventionally observed, and thereby allows effective suppression of time-varying fluctuations in output frequency.

In the present invention, in particular, the respective voltage-current conversion characteristics of the two voltage-current conversion circuits can be easily equalized. Even when the voltage-current conversion circuit used during normal operation is different from that used during the evaluation of the oscillation characteristics, the oscillation characteristics of the voltage controlled oscillator can be evaluated with high accuracy.

In the present invention, a voltage current conversion circuit having excellent linearity can be obtained.

In the present invention, it is also possible to monitor a potential at the loop filter during the operation of the PLL without adding a new circuit.

Additionally, in the present invention, it is possible to inspect the oscillation range of the voltage controlled oscillator and inspect the pull-in operation of the PLL circuit when the potential at the loop filter is adjusted to the ground voltage or the power source voltage.

When the potential at the loop filter is controlled to the ground voltage or the power source voltage, the present invention allows more prompt adjustment of the potential at the loop filter to the ground voltage or the power source voltage by increasing the charge/discharge currents in the charge pump circuit. As a result, the time required for inspecting the oscillation range of the voltage controlled oscillator and inspecting the pull-in operation of the PLL circuit can be effectively reduced.

Moreover, the present invention applies an arbitrary voltage to the loop filter by switching the charge current source and the discharge current source to the two variable resistors and varying the resistance values of the two variable resistors to allow evaluation of the oscillation characteristics of the voltage controlled oscillator with respect to the input voltage. As a result, unlike in the conventional PLL circuit, a selection switch for a selective switch to the input terminal for evaluating the oscillation characteristics of the voltage controlled oscillator need not be placed in the output portion of the loop filter in a high-impedance state. This allows complete elimination of time-varying fluctuations in the output voltage of the loop filter due to an extremely weak leakage current from the selection switch, which have been conventionally observed, and thereby allows effective suppression of time-varying fluctuations in output frequency.

In addition, in the present invention, it is possible to monitor the loop filter voltage during the operation of the PLL and recognize the voltage when a voltage is applied to the loop filter using the charge pump circuit without adding a new circuit.

Effect of the Invention

Thus, in the PLL circuit of the present invention, a selection switch for a selective switch to the input terminal for evaluating the oscillation characteristics of the voltage controlled oscillator need not be placed in the output portion of the loop filter in a high-impedance state, unlike in the conventional PLL circuit. This achieves the effect of allowing complete elimination of time-varying fluctuations in the output voltage of the loop filter due to an extremely weak leakage current from the conventional selection switch and thereby allowing effective suppression of time-varying fluctuations in output frequency.

DESCRIPTION OF NUMERALS

Figure 1:
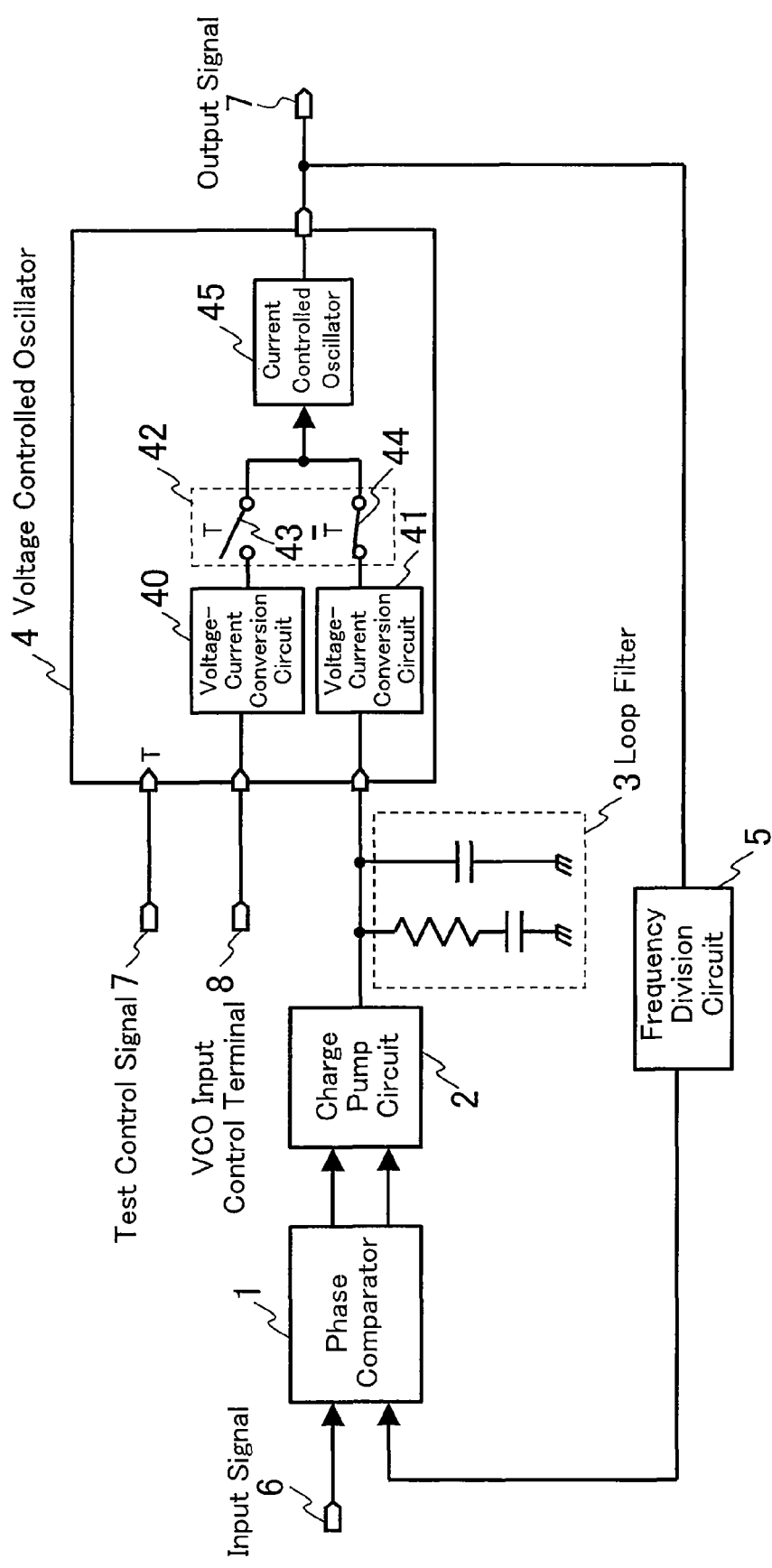
FIG. 1 is a view showing a structure of a PLL circuit in a first embodiment of the present invention.

1 Phase Comparator
2 Charge Pump Circuit
3 Loop Filter
4 Voltage Controlled Oscillator
5 Frequency Division Circuit
7 Test Control Signal
8 VCO Input Control Terminal
9 LPF Control Circuit (Control Circuit)
10 LPF Control Signal
35 Unity Gain Buffer
40, 41 Voltage-Current Conversion Circuits
42 Selection Circuit
45 Current Controlled Oscillator
52 Arithmetic Amplification Circuit

BEST MODE FOR CARRYING OUT THE INVENTION

Referring to the drawings, a PLL circuit in each of the embodiments of the present invention will be described hereinbelow.

Embodiment 1

FIG. 1 is a view showing a structure of the PLL circuit in the first embodiment of the present invention.

In FIG. 1, the PLL circuit is composed of a phase comparator 1 for detecting a phase difference between an input signal 6 and a signal obtained by dividing the frequency of an output of a VCO 4 with a frequency division circuit 5, a charge pump circuit 2 for supplying charges in accordance with a phase difference signal indicating the phase difference detected by the phase comparator 1, a loop filter 3 for smoothing an output signal from the charge pump circuit 2, the VCO 4 having an oscillation frequency thereof controlled by the voltage of the loop filter 3, and the frequency division circuit 5 for dividing the output of the VCO 4, which are connected in a loop-like configuration. The VCO 4 is composed of two input terminals, two voltage-current conversion circuits 40 and 41 for converting the respective voltages of the input terminals to currents, a selection circuit 42 for selecting either one of output currents from the two voltage-current conversion circuits 40 and 41 in accordance with a test control signal 7, and a CCO (Current Controlled Oscillator) 45 having an oscillation frequency thereof controlled by the current selected by the selection circuit 42. The VCO 4 has a structure in which one of the two input terminals thereof is connected to the loop filter 3 and the other input terminal is connected to the VCO input control terminal 8. Although the number of the input terminals of the VCO 4 is two herein, three or more input terminals may also be provided.

In a structure as described above, in the case of operation as the PLL circuit, the test control signal 7 turns OFF the switch 43 of the selection circuit 42 and turns ON the switch 44 thereof so that an output current from the voltage-current conversion circuit 41 connected to the loop filter 3 is selected by the selection circuit 42. As a result, the oscillation frequency of the VCO 4 is controlled with the voltage of the loop filter 3 so that the operation as the PLL circuit is performed.

Next, in the case of evaluation of the oscillation characteristics of the VCO 4, the test control signal 7 turns ON the switch 43 of the selection circuit 42 and turns OFF the switch 44 thereof so that an output current from the voltage-current conversion circuit 40 connected to the VCO input control terminal 8 is selected by the selection circuit 41. As a result, the VCO 4 is controlled by the VCO input control terminal 8 to be irrelevant to the voltage of the loop filter 3. This allows the application of an arbitrary voltage to the VCO input control terminal 8 and evaluation of the oscillation characteristics of the VCO 4.

In the PLL circuit thus constituted in the present embodiment, the selection switch 42 for evaluating the oscillation characteristics of the VCO 4 is placed in the stage subsequent to the two voltage-current conversion circuits 40 and 41 in the voltage controlled oscillator 4. Therefore, unlike in the conventional PLL circuit, the VCO input control terminal 8 for evaluating the oscillation characteristics of the VCO 4 need not be connected to the loop filter 3 in a high impedance state via a switch. This allows complete elimination of time-varying fluctuations in the voltage of the loop filter due to an extremely weak leakage current from the selection switch for evaluating the oscillation characteristics, which is added to the loop filter 3, and thereby allows suppression of time-varying fluctuations in output frequency.

Figure 2:
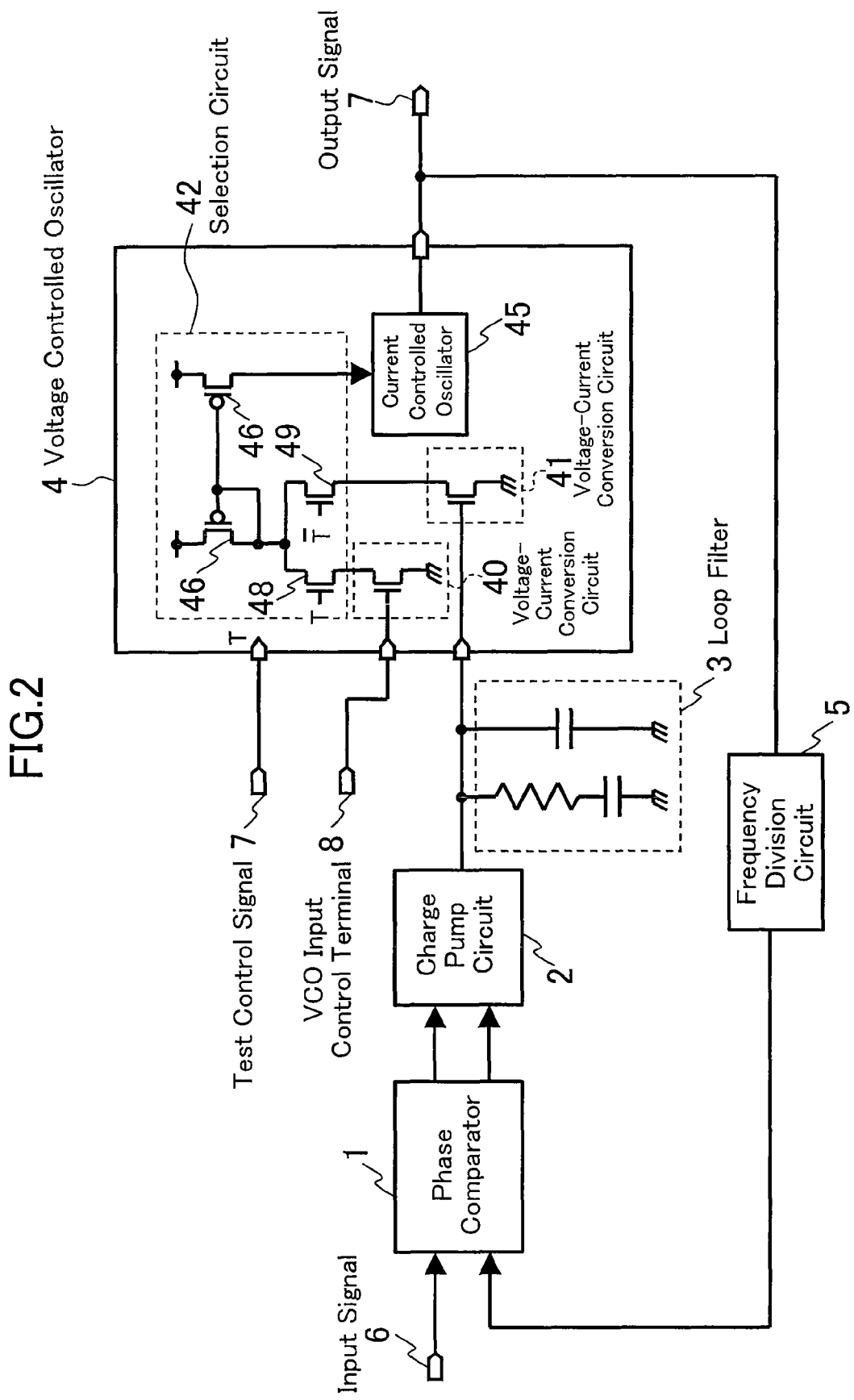
FIG. 2 is a view showing another example of a structure of a voltage controlled oscillator in the PLL circuit of the first embodiment.
Figure 3:
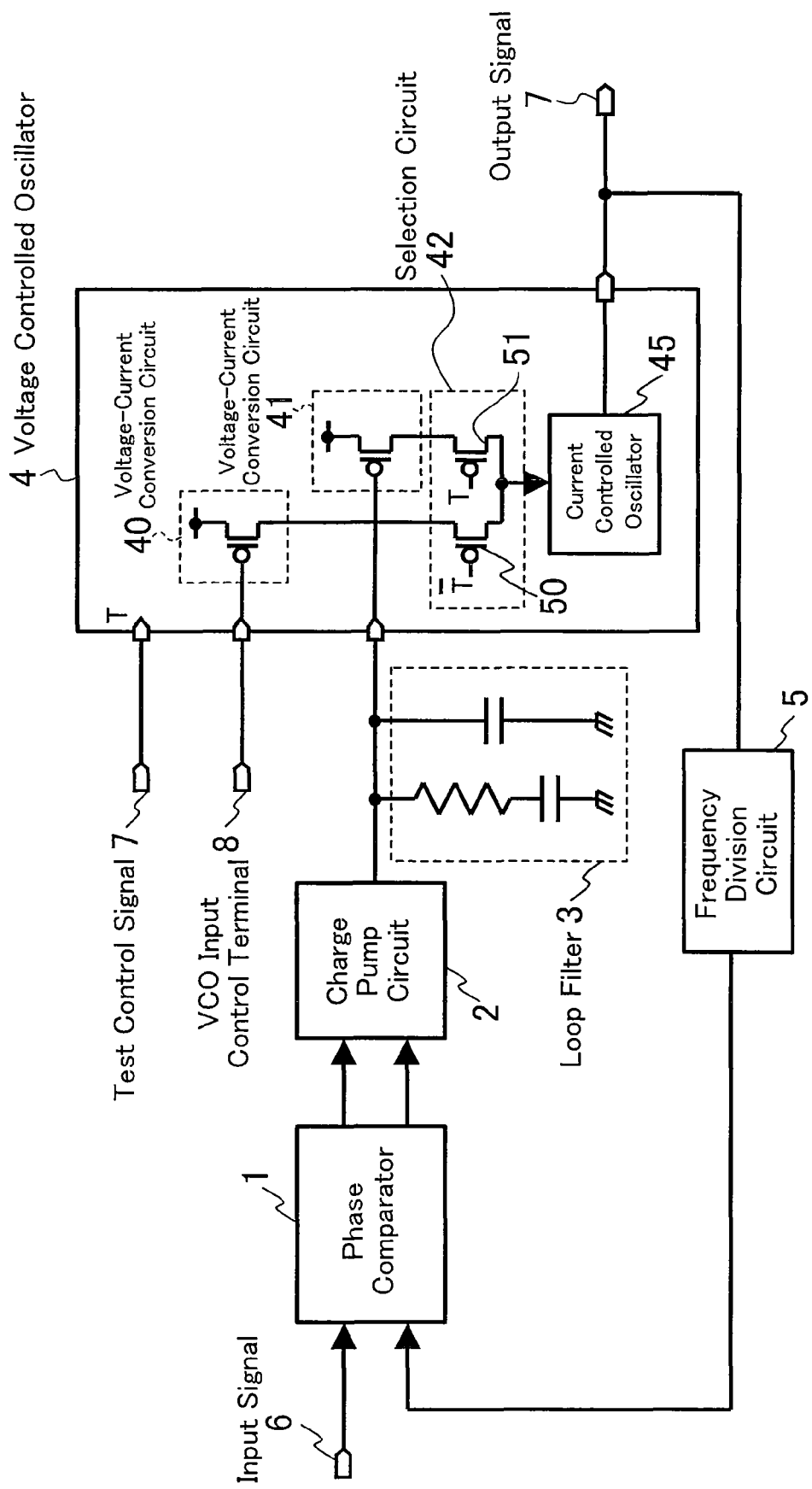
FIG. 3 is a view showing still another example of the structure of the voltage controlled oscillator in the PLL circuit of the first embodiment.

Examples of structures of the voltage-current conversion circuits 40 and 41 and the selection circuit 42 of the VCO 4 in FIG. 1 are shown in FIGS. 2 and 3.

In FIG. 2, each of the voltage-current conversion circuits 40 and 41 is composed of an N-channel transistor (hereinafter abbreviated as NTr) having a gate as an input terminal, a source as ground terminal, and a drain as an output terminal. The selection circuit 42 is constituted by a current mirror circuit for mirroring a current, which is composed of an NTr switch 48 connected to the voltage-current conversion circuit 40 using the VCO input control terminal 8 as an input, an NTr switch 49 connected to the voltage-current conversion circuit 41 using the loop filter 3 as an input, and P-channel transistors (hereinafter each abbreviated as PTr) 46 and 47.

In the structure of the VCO 4 of FIG. 2, in the case of operation as the PLL circuit, the test control signal 7 turns OFF the NTr switch 48 and turns ON the NTr switch 49. In the case of evaluation of the oscillation characteristics of the VCO 4, the PLL circuit operates such that the test control signal 7 turns ON the NTr switch 48 and turns OFF the NTr switch 49. Alternatively, the NTr switches 48 and 49 may be CMOS switches or PTr switches. It is also possible to adopt a structure which does not need the current mirror composed of the PTr 46 and the PTr 47.

Next, in FIG. 3, each of the voltage-current conversion circuits 40 and 41 is composed of a PTr having a gate as an input terminal, a source as a power source terminal, and a drain as an output terminal. The selection circuit 42 is composed of a PTr switch 50 connected to the voltage-current conversion circuit 40 using the VCO input control terminal 8 as an input and a PTr switch 51 connected to the voltage-current conversion circuit 41 using the loop filter 3 as an input. In the structure of the VCO 4 of FIG. 3, in the case of operation as the PLL circuit, the test control signal 7 turns OFF the PTr switch 50 and turns ON the PTr switch 51. In the case of evaluation of the oscillation characteristics of the VCO 4, the PLL circuit operates such that the test control signal 7 turns ON the PTr switch 50 and turns OFF the PTr switch 51. Alternatively, the PTr switches 50 and 51 may be CMOS switches or NTr switches.

In the structures of FIGS. 2 and 3 shown above, the selection circuit 42 for a switch to the VCO input control terminal (input terminal for evaluating the oscillation characteristics of the VCO) 8 is placed in a portion biased with a current inside the voltage controlled oscillator 4. Accordingly, unlike in the conventional PLL circuit, a selection switch need not be placed in the output portion of the loop filter 3 in a high-impedance state. This allows complete elimination of time-varying fluctuations in the output voltage of the loop filter due to an extremely weak leakage current from the selection switch, which have been conventionally observed, and allows effective suppression of time-varying fluctuations in output frequency.

In addition, in the structures of FIGS. 2 and 3 shown above, the voltage-current conversion circuits 40 and 41 can be composed only of NTrs or PTrs. Accordingly, the same voltage-current conversion characteristics can be easily obtained by merely placing only NTrs or PTr in proximity. As a result, even though the voltage-current conversion circuit used during normal operation is different from that used during evaluation of the oscillation characteristics, the two voltage-current conversion circuits 40 and 41 have the same voltage-current conversion characteristics. Therefore, it is possible to evaluate the characteristics of the voltage controlled oscillator 4 with high accuracy.

Embodiment 2

A PLL circuit in the second embodiment of the present invention will be described herein below with reference to the drawings.

Figure 4:
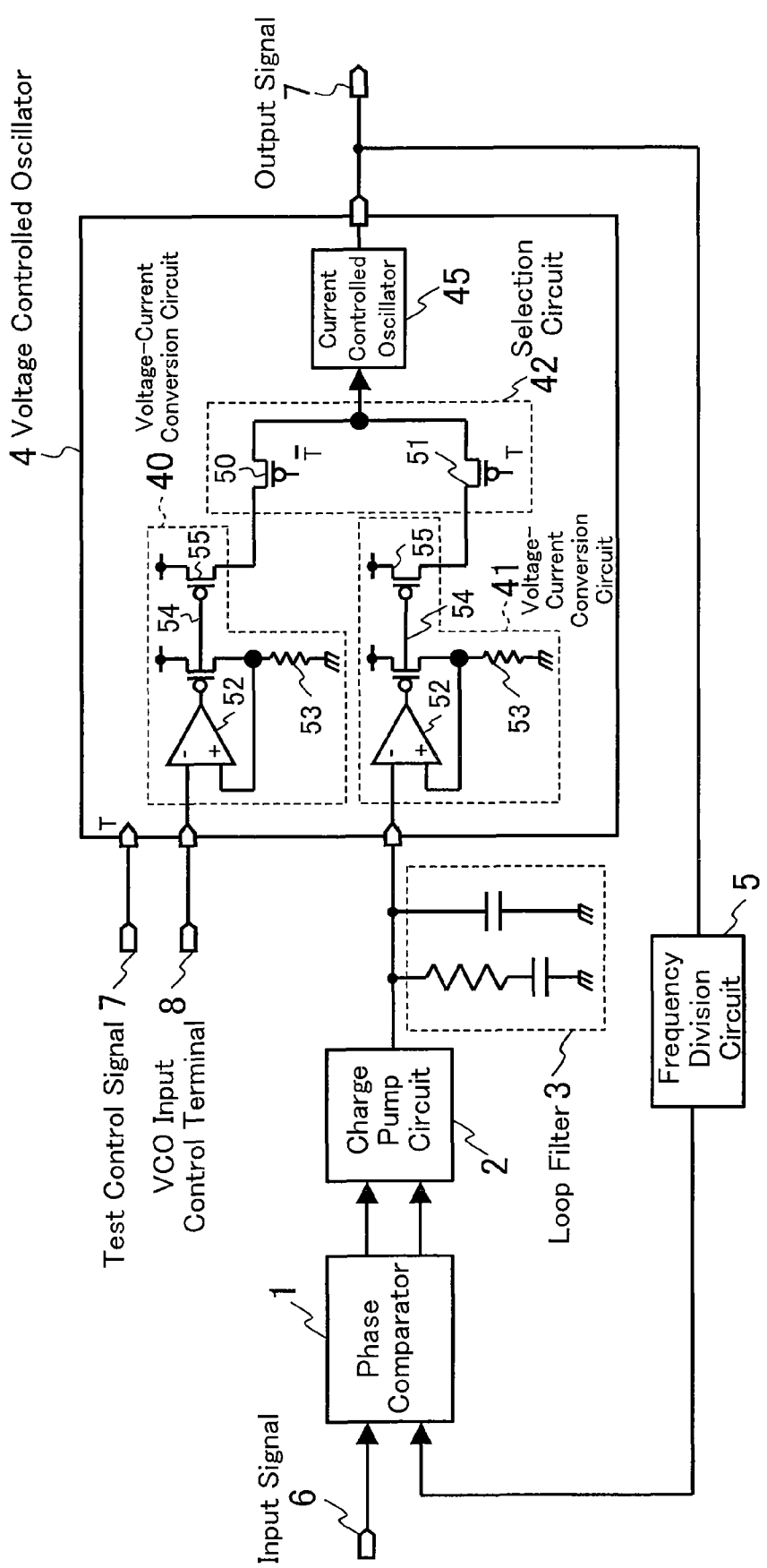
FIG. 4 is a view showing a structure of a PLL circuit in a second embodiment of the present invention.

FIG. 4 is a view showing a structure of the PLL circuit in the second embodiment of the present invention.

Of the components shown in FIG. 4, those having the same structures as in the first embodiment are designated by the same reference numerals and a detailed description thereof will be omitted.

In FIG. 4, the second embodiment is different from the first embodiment in that each of the voltage-current conversion circuits 40 and 41 is composed of an arithmetic amplifier 52 having a negative-electrode input terminal used as the input terminal of voltage-current conversion circuit, a PTr 54 having a gate terminal connected to an output of the arithmetic amplifier 52, a source terminal connected to a power source, and a drain terminal connected to the positive-electrode input of the arithmetic amplifier 52, a resistor 53 connected between the drain terminal of the PTr 54 and the ground, and a PTr 55 having a gate terminal connected to the output of the arithmetic amplifier 52, a source terminal connected to the power source, and a drain terminal as an output of the voltage-current conversion circuit.

In a structure as shown above, the positive-electrode voltage of the arithmetic amplifier 52 is equal to the input voltage of each of the voltage-current conversion circuits and applied to the resistor 53. As a result, a current having a value obtained by dividing the input voltage of the voltage-current conversion circuit by the resistance value of the resistor 53 flows in the PTr 54. The current is then mirrored by the PTr 55 to become the output current of the voltage-current conversion circuit. Since the resistance value of the resistor 53 is constant, the voltage-current conversion circuit having excellent linearity can be obtained by adopting a structure as shown above.

Embodiment 3

A PLL circuit in the third embodiment of the present invention will be described herein below with reference to the drawings.

Figure 5:
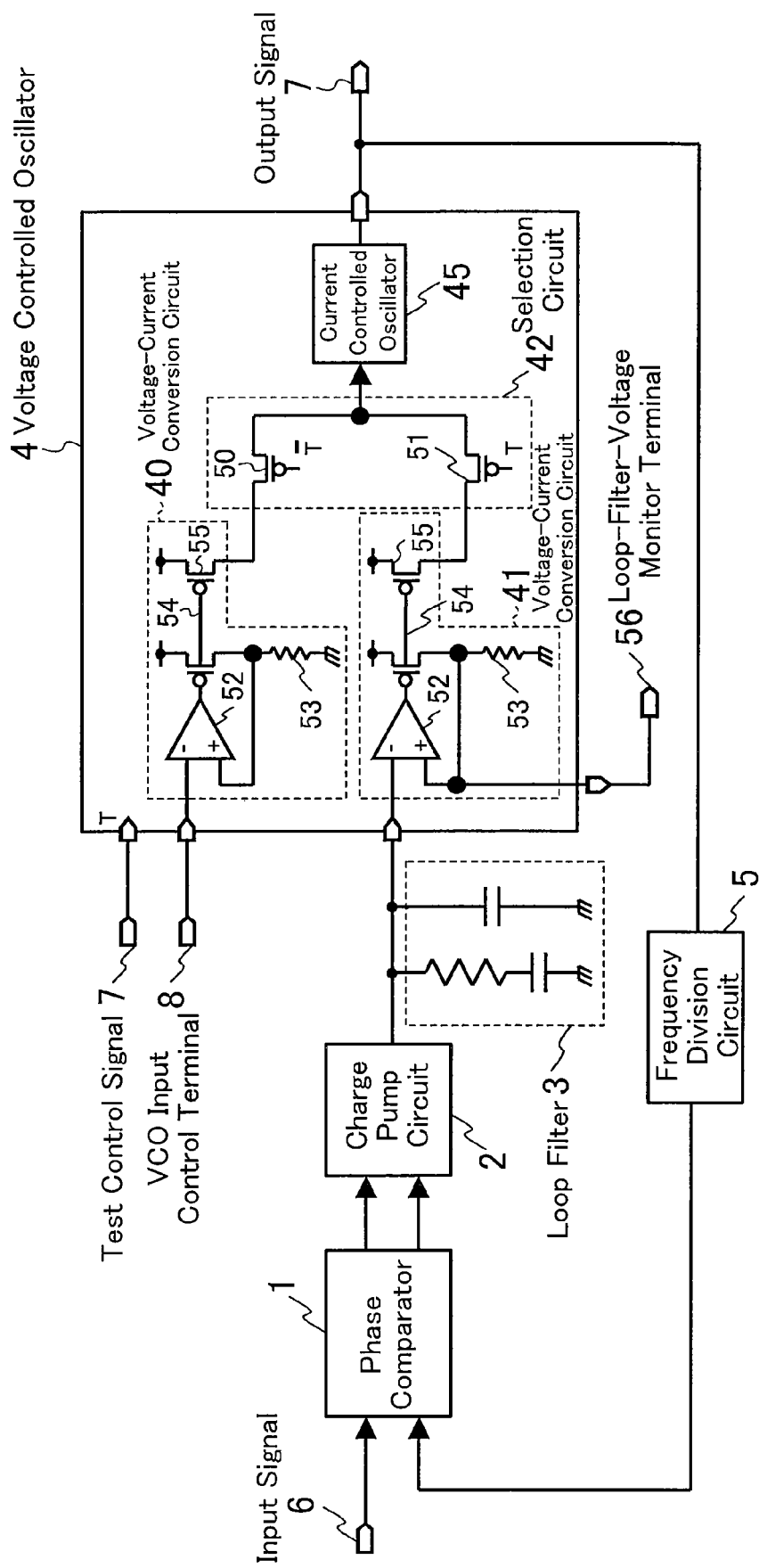
FIG. 5 is a view showing a structure of a PLL circuit in a third embodiment of the present invention.

FIG. 5 is a view showing a structure of the PLL circuit in the third embodiment of the present invention.

Of the components shown in FIG. 5, those having the same structures as in the second embodiment are designated by the same reference numerals and a detailed description thereof will be omitted.

In FIG. 5, the third embodiment is different from the second embodiment in that the positive-electrode input terminal of the arithmetic amplifier 52 composing the voltage-current conversion circuit 41 receiving the voltage of the loop filter 3 is connected to a loop-filter-voltage monitor terminal 56 for monitoring the voltage of the loop filter 3.

By thus adopting a structure as shown above, it becomes possible to monitor a potential at the loop filter during the operation of the PLL without adding a new circuit.

Embodiment 4

A PLL circuit in the fourth embodiment of the present invention will be described herein below with reference to the drawings.

Figure 6:
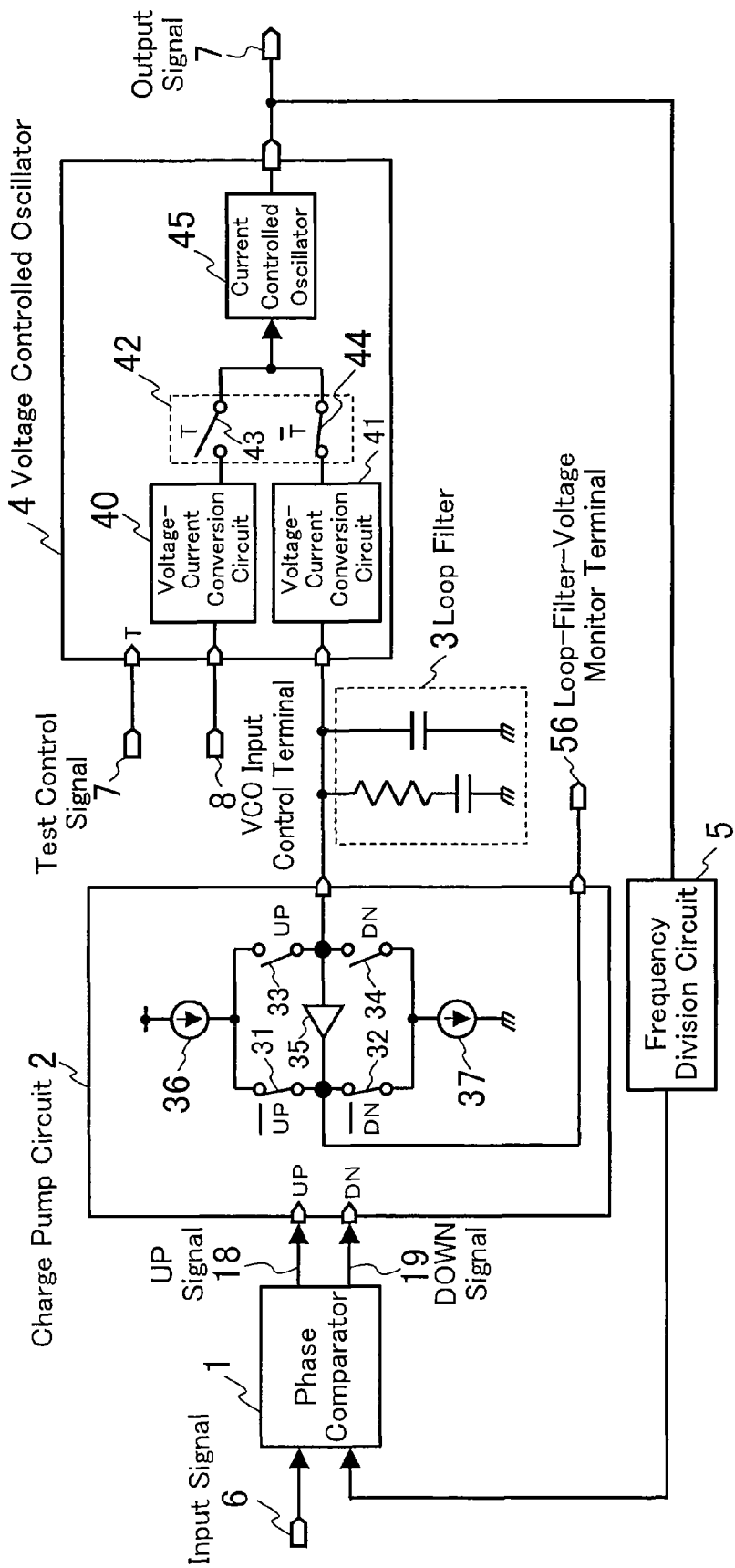
FIG. 6 is a view showing a structure of a PLL circuit in a fourth embodiment of the present invention.

FIG. 6 is a view showing a structure of the PLL circuit in the fourth embodiment of the present invention.

Of the components shown in FIG. 6, those having the same structures as in the first embodiment are designated by the same reference numerals and a detailed description thereof will be omitted.

In FIG. 6, the fourth embodiment is different from the first embodiment in that the output terminal of a unity gain buffer 35 composing the charge pump circuit 2 is connected to the loop-filter-voltage monitor terminal 56.

As shown in FIG. 6, a typical charge pump circuit is composed of a charge current source 36, a discharge current source 37, a switch 33 connected between the charge current source 36 and an output of the charge pump circuit, a switch 34 connected between the discharge current source 37 and the output of the charge pump circuit 2, the unity gain buffer 35 having an input connected to the output of the charge pump circuit, a switch 31 connected between the charge current source 36 and an output of the unity gain buffer 35, and a switch 32 connected between the discharge current source 37 and the output of the unity gain buffer 35.

When an UP signal 18 is inputted from the phase comparator 1, the switch 33 is turned ON and the switch 31 is turned OFF. When the UP signal 18 is not inputted, the switch 33 is turned OFF and the switch 31 is turned ON. When a DOWN signal 19 is inputted from the phase comparator 1, the switch 34 is turned ON and the switch 32 is turned OFF. When the DOWN signal 19 is not inputted, the switch 34 is turned OFF and the switch 32 is turned ON. This allows the charge pump circuit 2 to output charges in accordance with the phase difference signal detected by the phase comparator 1 to the loop filter 3.

During the period in which the UP signal 18 and the down signal 19 are not inputted from the phase comparator 1, the unity gain buffer 35 mentioned above functions to apply the voltage of the loop filter 3 to the charge current source 36 and the discharge current source 37 via the switch 31 and the switch 32. This allows a specified current to be promptly outputted since, when the UP signal 18 or the DOWN signal 19 is inputted from the phase comparator 1, the charge current source 36 and the discharge current source 37 are in a state in which the voltage of the loop filter 3 has been already applied thereto.

In the fourth embodiment, the output of the unity gain buffer 35 composing the typical charge pump circuit mentioned above is used as the voltage monitor terminal for the loop filter 3. Because the unity gain buffer 35 outputs the voltage of the loop filter 3 as described above, the output of the unity gain buffer 35 can be used without any alteration for the loop-filter voltage monitor terminal 56.

That is, by adopting a structure as shown above, it becomes possible to monitor the potential at the loop filter 3 during the operation of the PLL without adding a new circuit.

It is to be noted that the same structure can also be adopted in the second embodiment.

Embodiment 5

A PLL circuit in the fifth embodiment of the present invention will be described herein below with reference to the drawings.

Figure 7:
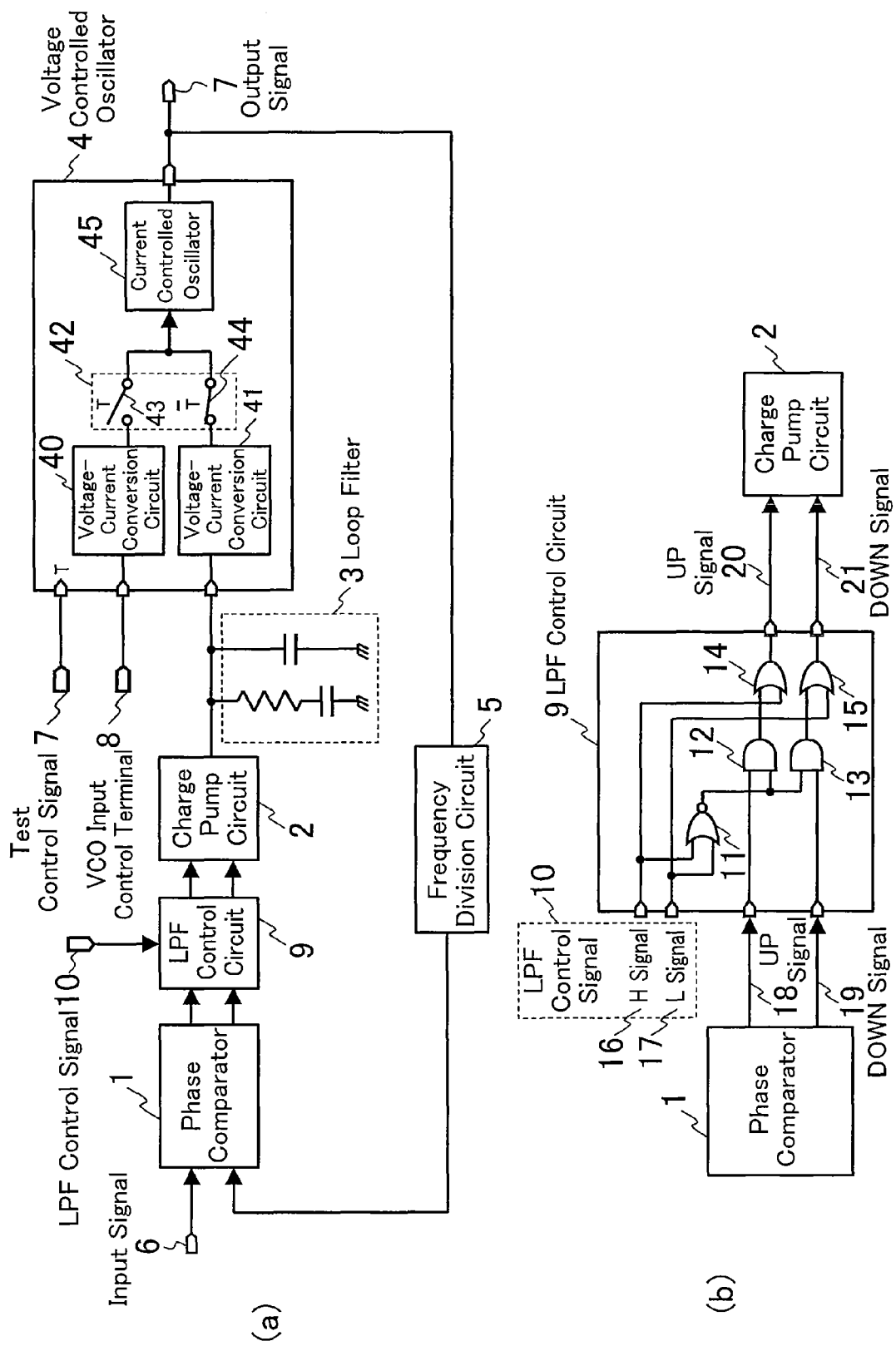
FIG. 7(a) is a view showing a structure of a PLL circuit in a fifth embodiment of the present invention and FIG. 7(b) is a view showing a structure of a LPF control circuit provided in the PLL circuit of the fifth embodiment.

FIG. 7(a) is a view showing a structure of the PLL circuit in the fifth embodiment of the present invention. FIG. 7(b) is a view showing a structure of a newly added LPF control circuit.

Of the components shown in FIG. 7(a), those having the same structures as in the first embodiment are designated by the same reference numerals and a detailed description thereof will be omitted.

In FIG. 7(a), the fifth embodiment is different from the first embodiment in that the LPF control circuit (control circuit) 9 is placed between the phase comparator 1 and the charge pump circuit 2. The LPF control circuit 9 has the function of continuing to charge the loop filter 3 to provide a power source voltage or continuing to discharge the loop filter 3 to provide a ground voltage by controlling the output state of the charge pump circuit 2 with a LPF control signal 10.

FIG. 7(b) shows an example of a structure of the LPF control circuit 9.

In FIG. 7(b), the LPF control circuit 9 is composed of a NOR circuit 11 receiving a H signal 16 and a L signal 17 of the LPF control signal 10, an AND circuit 12 receiving the UP signal 18 of the phase comparator 1 and an output of the NOR circuit 11 mentioned above, an AND circuit 13 receiving the DOWN signal 19 of the phase comparator 1 and the output of the NOR circuit 11 mentioned above, an OR circuit 14 receiving the H signal 16 of the LPF control signal 10 and an output of the AND circuit 12 mentioned above, and an OR circuit 15 receiving the L signal 17 of the LPF control signal 10 and an output of the AND circuit 13 mentioned above. The output of the OR circuit 14 mentioned above becomes an UP signal 20 for bringing the output state of the charge pump circuit 2 into a charge output state. The output of the OR circuit 15 mentioned above becomes a DOWN signal 21 for bringing the output state of the charge pump circuit 2 into a discharge output state.

In a structure as shown above, when the voltage of the loop filter 3 is adjusted to the power source voltage, the H signal 16 of the LPF control signal 10 is brought to the High level and the L signal 17 of the LPF control signal 10 is brought to the Low level. Accordingly, the output of the NOR circuit 11 becomes Low and the UP signal 18 and the down signal 19 from the phase comparator 1 are gated by the AND circuits 12 and 13 so that the Low output is inputted to one input of each of the OR circuits 14 and 15. Because the H signal 16 in the High level is inputted to the other input of the OR circuit 14, the UP signal 20 becomes High. Because the L signal 17 on the Low level is inputted to the other input of the OR circuit 15, the DOWN signal 21 becomes Low. As a result, the output of the charge pump circuit 2 continues to charge the loop filter 3 so that the voltage of the loop filter 3 is adjusted to the power source voltage.

Next, when the voltage of the loop filter 3 is adjusted to the ground voltage, the H signal 16 of the LPF control signal 10 is brought into the Low sate and the L signal 17 of the LPF control signal 10 is brought to the High level. Accordingly, the output of the NOR circuit 11 becomes Low and the UP signal 18 and the DOWN signal 19 from the phase comparator 1 are gated by the AND circuits 12 and 13 so that the Low output is inputted to one input of each of the OR circuits 14 and 15. Because the H signal 16 on the Low level is inputted to the other input of the OR circuit 14, the UP signal 20 becomes Low. Because the L signal 17 on the High level is inputted to the other input of the OR circuit 15, the DOWN signal 21 becomes High. As a result, the output of the charge pump circuit 2 continues to discharge the loop filter 3 so that the voltage of the loop filter 3 is adjusted to the ground voltage.

Next, in the case of causing operation as a normal PLL circuit, each of the H signal 16 and the L signal 17 of the LPF control signal 10 is brought to the Low level. Accordingly, the output of the NOR circuit 11 becomes High and the AND circuits 12 and 13 allow the UP signal 18 and the DOWN signal 19 each from the phase comparator 1 to pass therethrough without any alteration. Because the H signal 16 and the L signal 17, which are input signals to the OR circuits 14 and 15, are on the Low level, the OR circuits 14 and 15 allow output signals from the AND circuits 12 and 13 to pass therethrough without any alteration. That is, the UP signal 20 and the DOWN signal 21, which are output signals from the LPF control circuit 9, become the UP signal 18 and the DOWN signal 19 each from the phase comparator 1. Thus, the operation as a normal PLL circuit is performed.

With a structure as described above, it is possible to inspect the pull-in operation of the PLL circuit after the voltage of the loop filter 3 is adjusted to the ground voltage and inspect the pull-in operation of the PLL circuit after the voltage of the loop filter 3 is adjusted to the power source voltage without adding an extra circuit to the loop filter 3. In addition, it is also possible to recognize the range of the oscillation frequency of the VCO 4 by measuring the oscillation frequency of the VCO 4 when the voltage of the loop filter 3 is adjusted to the ground voltage and to the power source voltage without using the VCO input control terminal 8.

Embodiment 6

A PLL circuit in the sixth embodiment of the present invention will be described herein below with reference to the drawings.

Figure 8:
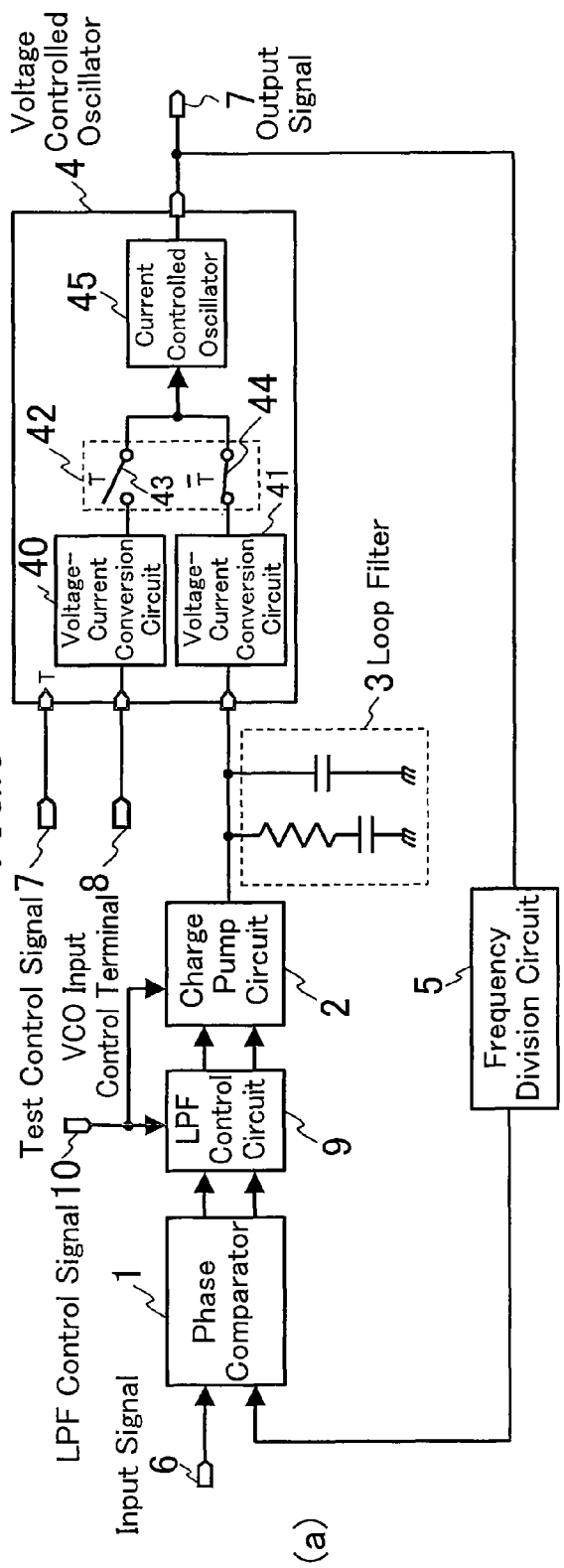
FIG. 8(a) is a view showing a structure of a PLL circuit in a sixth embodiment of the present invention and FIG. 8(b) is a view showing respective internal structures of the LPF control circuit and a charge pump circuit each provided in the PLL circuit of the sixth embodiment.
Figure 8:
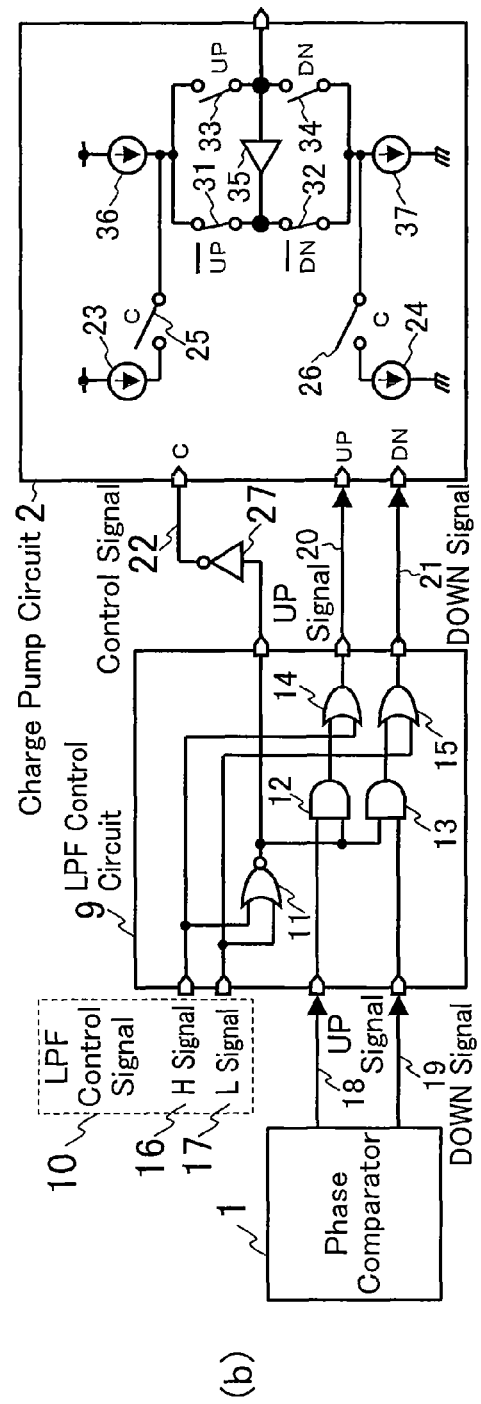

FIG. 8(a) is a view showing a structure of the PLL circuit in the sixth embodiment of the present invention. FIG. 8(b) is a view showing examples of respective structures of the LPF control circuit 9 and the charge pump circuit 2 in FIG. 8(a).

Of the components shown in FIGS. 8(a) and 8(b), those having the same structures as in the fifth embodiment are designated by the same reference numerals and a detailed description thereof will be omitted.

In FIG. 8(a), the sixth embodiment is different from the fifth embodiment in that the PLL circuit is composed of the charge pump circuit 2 having the function of increasing charge/discharge currents with the LPF control signal 10, which is inputted also to the charge pump circuit 2.

In FIG. 8(b), the charge pump circuit 2 has a structure obtained by adding switches 25 and 26 controlled by a control signal 22, a current source 23 connected in parallel to the charge current source 36 via the switch 25 mentioned above, and a current source 24 connected in parallel to the discharge current source 37 via the switch 26 mentioned above to the typical charge pump circuit described in the fourth embodiment. In the examples of the structures of FIG. 8(b), the control signal 22 inputted to the charge pump circuit 2 is generated by inverting the output of the NOR circuit 11 in the output control circuit 9 with an inverter circuit 27. This eliminates the necessity to constitute a logic gate for receiving the H signal 16 and the L signal 17 of the LPF controls signal 10 to determine that a control operation is being performed with the LPF outputs.

In a structure as shown above, when the output state of the charge pump circuit 2 is controlled by inputting the H signal 16 and the L signal 17 of the LPF control signal 10 and the voltage of the loop filter 3 is adjusted to the ground voltage or the power source voltage, the control signal 22 is inputted to the charge pump circuit 22 so that the switches 25 and 26 are turned ON. As a result, the current sources 23 and 26 are respectively connected in parallel to the charge current source 36 and the discharge current source 37, so that the charge/discharge currents outputted to the loop filter 3 are increased. In the case of normal operation as the PLL circuit, the control signal 22 is not inputted so that the switches 25 and 26 are turned OFF and the charge/discharge currents of the charge pump circuit 2 are in amounts during normal operation.

With a structure as shown above, the charge/discharge currents of the charge pump circuit 2 can be increased when the voltage of the loop filter 3 is adjusted to the ground voltage or the power source voltage with the charge/discharge currents. As a result, it is possible to promptly adjust the voltage of the loop filter 3 to the ground voltage or the power source voltage. In other words, the time required to recognize the pull-in operation of the PLL and recognize the range of the oscillation frequency of the VCO 4 after the voltage of the loop filter 3 is adjusted to the ground voltage or the power source voltage can be reduced.

Embodiment 7

A PLL circuit in the seventh embodiment of the present invention will be described herein below with reference to the drawings.

Figure 9:
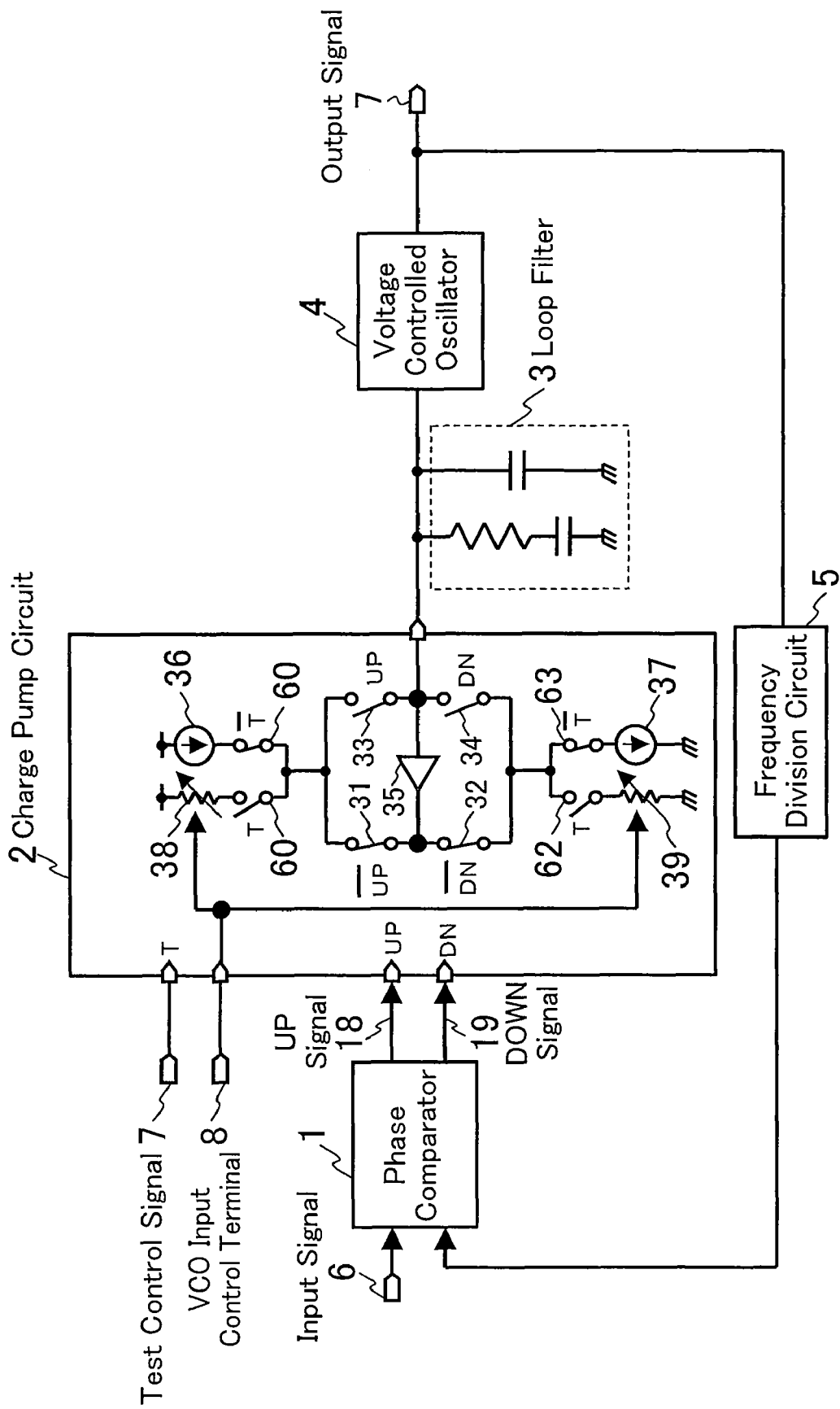
FIG. 9 is a view showing a structure of a PLL circuit in a seventh embodiment of the present invention.

FIG. 9 is a view showing a structure of the PLL circuit in the seventh embodiment of the present invention. Of the components shown in FIG. 9, those having the same structures as in the first embodiment are designated by the same reference numerals and a detailed description thereof will be omitted.

In FIG. 9, the seventh embodiment is different from the first embodiment in that a test control signal terminal 7 and a VCO input control terminal 8 are provided in the charge pump circuit 2 and the charge pump circuit 2 has the function of giving an arbitrary voltage to the loop filter 3 in accordance with the test control signal 7 and a signal from the VCO input control terminal 8.

In FIG. 9, the charge pump circuit 2 has a structure obtained by adding switches 60 and 61 for switching between the charge current source 36 and a variable resistor 38 in accordance with the test control signal (control signal) 7 and switches 62 and 63 for switching between the discharge current source 37 and a variable resistor 39 in accordance with the test control signal 7 to the typical charge pump circuit described in the fourth embodiment. The two variable resistors 38 and 39 are allowed to have resistance values thereof varied by the signal from the VCO input control terminal 8.

In a structure as shown above, in the case of operation as the PLL circuit, the switches 60 and 61 are respectively connected to the charge current source 36 and the discharge current source 37 by the test control signal 7. As a result, the charge pump circuit 2 in FIG. 9 has exactly the same structure as the typical charge pump circuit 2 described in the fourth embodiment to operate as a charge pump circuit.

Next, in the case of evaluation of the oscillation characteristics of the VCO 4, the switches 60 and 62 are respectively connected to the variable resistors 38 and 39 by the test control signal 7. The switches 31, 32, 33, and 34 do not cause the operation as the charge pump circuit described in the fourth embodiment. The switches 33 and 34 are forcibly turned ON and the switches 31 and 32 are forcibly turned OFF. Consequently, the variable resistors 38 and 39 are connected to the loop filter 3. By varying the resistance values of the variable resistors 38 and 39 in accordance with the signal from the VCO input control terminal, an arbitrary voltage can be applied to the loop filter 3. This allows evaluation of the oscillation characteristics of the VCO 4 with respect to the input voltage.

By thus adopting a structure as shown above, it is no more necessary to add the terminal for applying the input voltage for evaluating the oscillation characteristics of the VCO to the loop filter 3 in a high-impedance state via a switch. This allows complete elimination of time-varying fluctuations in the voltage of the loop filter due to an extremely weak leakage current from the switch and thereby allows suppression of time-varying fluctuation in output frequency.

Embodiment 8

A PLL circuit in the eighth embodiment of the present invention will be described herein below with reference to the drawings.

Figure 10:
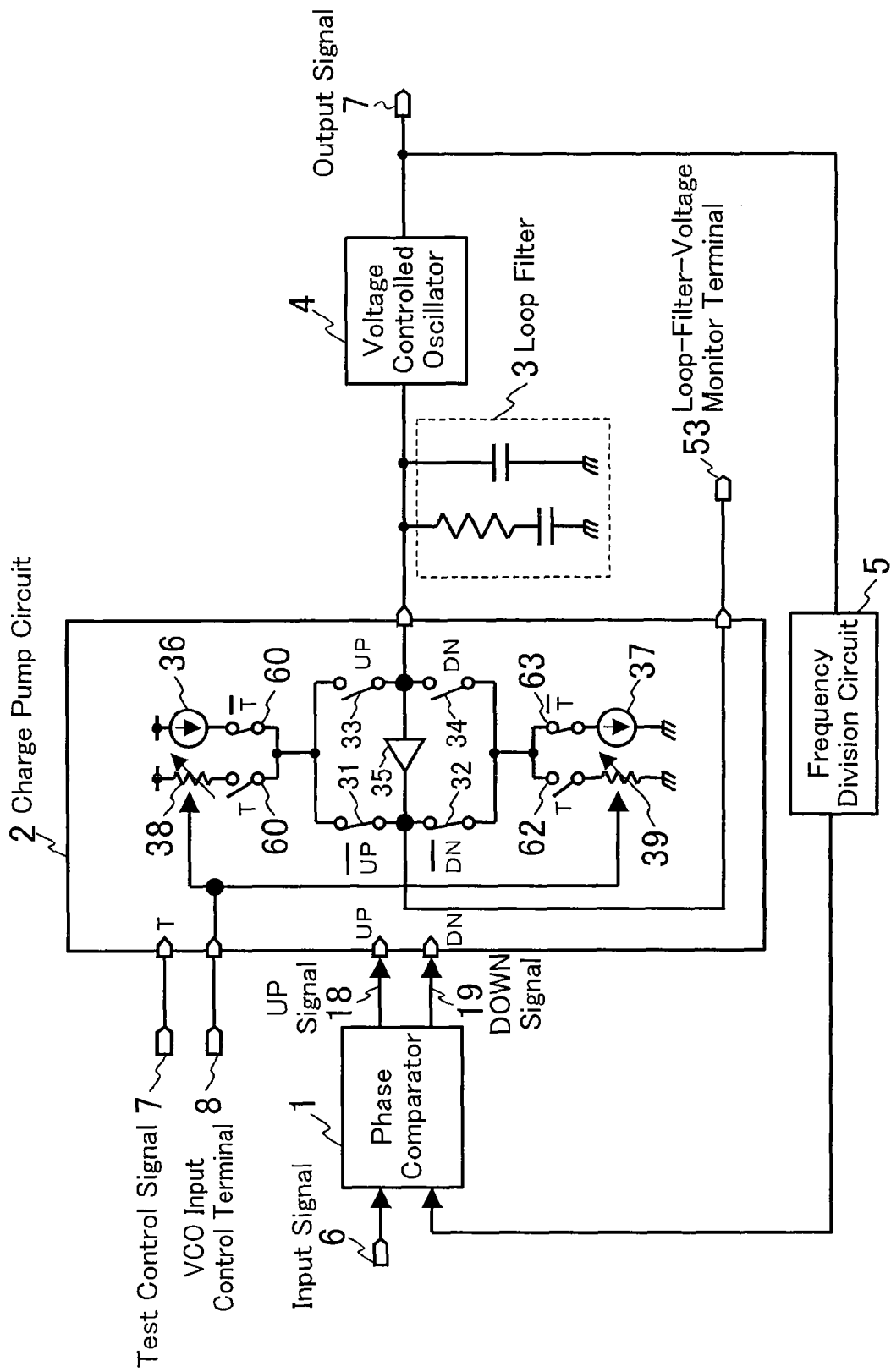
FIG. 10 is a view showing a structure of a PLL circuit in an eighth embodiment of the present invention.
Figure 11:
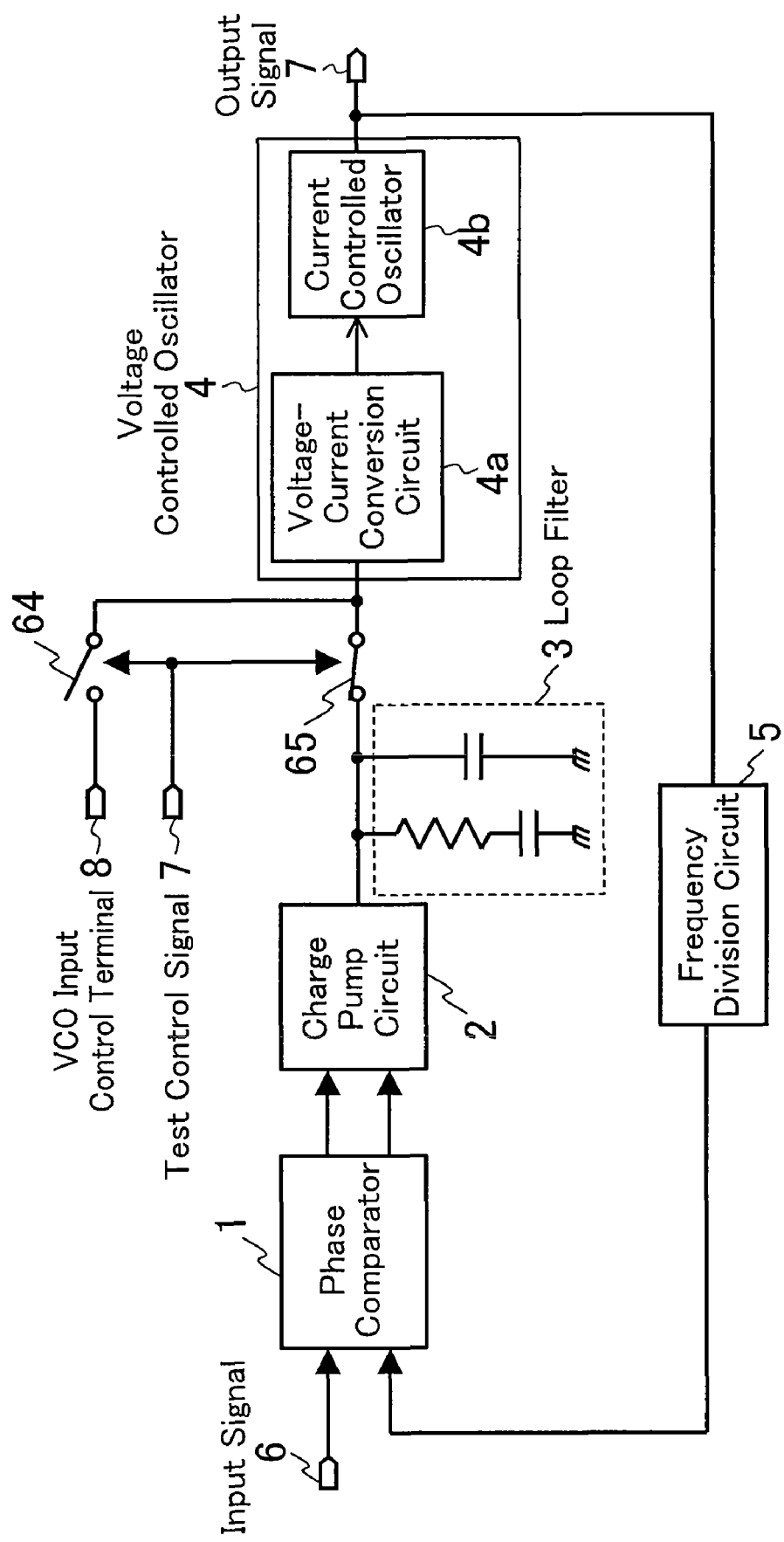
FIG. 11 is a view showing a structure of a conventional PLL circuit.

FIG. 10 is a view showing a structure of the PLL circuit in the eighth embodiment of the present invention. Of the components shown in FIG. 10, those having the same structures as in the seventh embodiment are designated by the same reference numerals and a detailed description thereof will be omitted.

In FIG. 10, the eighth embodiment is different from the seventh embodiment in that the output side of the unity gain buffer 36 composing the charge pump circuit 2 is used as the loop-filter-voltage monitor terminal 56.

By thus adopting such a structure, it is possible to monitor the voltage of the loop filter 3 during the operation of the PLL without adding a new circuit. In addition, when an arbitrary voltage is given to the loop filter 3, it is possible to use the output side of the unity gain buffer 35 as a monitor terminal for checking whether or not a voltage determined by the resistance ratio between the variable resistors 38 and 39 is applied from the charge pump circuit 2.

INDUSTRIAL APPLICABILITY

As described above, the present invention allows suppression of time-varying fluctuations in output frequency due to a switch for evaluating the oscillation characteristics of the voltage controlled oscillator so that it is useful as a PLL circuit mounted in a semiconductor integrated circuit.

What is claimed is:

1. A PLL circuit comprising:
   a phase comparator;
   a charge pump circuit;
   a loop filter;
   a voltage controlled oscillator; and
   a frequency division circuit, wherein
   the voltage controlled oscillator comprises:
   at least two input terminals;
   two voltage-current conversion circuits for converting respective voltages at the two input terminals to currents;
   a selection circuit for selecting either one of the two voltage-current conversion circuits; and
   an oscillator having an oscillation frequency thereof varied by an output current from the voltage-current conversion circuit selected by the selection circuit and
   at least one of the input terminals of the voltage controlled oscillator is connected to the loop filter and at least one other of the input terminals serves as an input terminal for evaluating the voltage controlled oscillator.

2. The PLL circuit of claim 1, wherein each of the voltage-current conversion circuits is composed of an N-channel transistor having a gate as an input terminal, a source as a ground terminal, and a drain as an output terminal.

3. The PLL circuit of claim 1, wherein each of the voltage-current conversion circuits is composed of a P-channel transistor having a gate as an input terminal, a source as a power source terminal, and a drain as an output terminal.

4. The PLL circuit of claim 1, wherein each of the voltage-current conversion circuits is composed of:
   an arithmetic amplifier using one of the two input terminals as a negative-electrode input;
   a P-channel transistor having a gate connected to an output of the arithmetic amplifier, a source connected to a power source terminal, and a drain connected to a positive-electrode input of the arithmetic amplifier;
   a resistor connected between the drain of the P-channel transistor and a ground terminal; and
   a P-channel transistor having a gate connected to the output of the arithmetic amplifier, a source connected to the power source terminal, and a drain as an output terminal.

5. The PLL circuit of claim 4, wherein, in each of the voltage-current conversion circuits, the arithmetic amplifier having the negative-electrode input to which the input terminal connected to the loop filter is connected has a terminal for monitoring a voltage of the loop filter connected to the positive-electrode input of the arithmetic amplifier.

6. The PLL circuit of claim 1, wherein the charge pump circuit is composed of:
   a charge current source;
   a discharge current source;
   a switch connected between the charge current source and an output side of the charge pump circuit;
   a switch connected between the discharge current source and the output side of the charge pump circuit;
   a unity gain buffer having an input connected to the output side of the charge pump circuit;
   a switch connected between the charge current source and an output side of the unity gain buffer; and
   a switch connected between the discharge current source and the output side of the unity gain buffer, wherein
   the output side of the unity gain buffer composing the charge pump circuit is used as the terminal for monitoring the voltage of the loop filter.

7. The PLL circuit of claim 1, further comprising:
   a control circuit for controlling a state of the output of the charge pump circuit to adjust the voltage of the loop filter to a ground voltage or a power source voltage.

8. The PLL circuit of claim 7, wherein the charge pump circuit has the function of increasing charge/discharge currents in adjusting the voltage of the loop filter to the ground voltage or the power source voltage using the control circuit.

9. A PLL circuit comprising:
   a phase comparator;
   a charge pump circuit;
   a loop filter;
   a voltage controlled oscillator; and
   a frequency division circuit, wherein the charge pump circuit comprises:
   a charge current source;
   a discharge current source;
   a switch connected between the charge current source and an output of the charge pump circuit;
   a switch connected between the discharge current source and the output of the charge pump circuit;
   a unity gain buffer having an input connected to the output of the charge pump circuit;
   a switch connected between the charge current source and an output of the unity gain buffer; and
   a switch connected between the discharge current source and the output of the unity gain buffer,
   the PLL circuit further comprising:
   two variable resistors; and
   switches for switching the charge current source and the discharge current source to the two variable resistors each in accordance with a control signal,
   the PLL circuit having the function of applying an arbitrary voltage to the loop filter by controlling a resistance ratio between the two variable resistors when the charge current source and the discharge current source are switched to the two variable resistors.

10. The PLL circuit of claim 9, wherein the output of the unity gain buffer of the charge pump circuit is used as a monitor terminal for monitoring a voltage of the loop filter.

11. A PLL circuit comprising:
    a loop filter;
    an oscillator;
    a first voltage-current conversion circuit to which a voltage controllable from the outside is inputted;
    a first switch disposed between an output terminal of the first voltage-current conversion circuit and an input terminal of the current controlled oscillator;

a second switch having one terminal connected to the first switch and to the input terminal of the current controlled oscillator; and a second voltage-current conversion circuit disposed between the other terminal of the second switch and the loop filter, wherein a signal is input such that, when the first switch is turned on, the second switch is turned off, and when the second switch is turned on, the first switch is turned off.

* * * * *